US010105563B2

(12) United States Patent
Feng

(10) Patent No.: US 10,105,563 B2
(45) Date of Patent: Oct. 23, 2018

(54) FIRE EXTINGUISHING DEVICE AND METHOD THEREOF

(71) Applicant: Xianqiang Fu, Shenzhen, Guangdong (CN)

(72) Inventor: Xuanyu Feng, Guangdong (CN)

( * ) Notice: Subject to any disclaimer, the term of this patent is extended or adjusted under 35 U.S.C. 154(b) by 0 days.

(21) Appl. No.: 15/502,508

(22) PCT Filed: May 9, 2014

(86) PCT No.: PCT/CN2014/077172

§ 371 (c)(1),
(2) Date: Feb. 8, 2017

(87) PCT Pub. No.: WO2015/168942

PCT Pub. Date: Nov. 12, 2015

(65) Prior Publication Data

US 2017/0216643 A1 Aug. 3, 2017

(51) Int. Cl.

| | |
|---|---|
| ***A62C 3/00*** | (2006.01) |
| ***A62C 35/02*** | (2006.01) |
| ***A62C 35/13*** | (2006.01) |
| ***A62C 37/12*** | (2006.01) |
| ***G08B 17/10*** | (2006.01) |
| *G08B 17/00* | (2006.01) |

(52) U.S. Cl.

CPC ................ *A62C 37/12* (2013.01); *A62C 3/00* (2013.01); *A62C 35/13* (2013.01); *G08B 17/10* (2013.01); *G08B 17/00* (2013.01); *H05K 999/99* (2013.01)

(58) Field of Classification Search

CPC ........... A62C 3/00; A62C 3/006; A62C 3/008; A62C 35/02; A62C 35/13; A62C 37/10; A62C 37/11; A62C 37/12; G08B 17/10

See application file for complete search history.

(56) References Cited

U.S. PATENT DOCUMENTS 3,773,111 A * 11/1973 Dunn .................... A62C 3/006 169/26
4,253,527 A 3/1981 Wilhoit (Continued)

FOREIGN PATENT DOCUMENTS

| | | |
|---|---|---|
| CN | 1375344 A | 10/2002 |
| GB | 191012532 A | 5/1911 |

OTHER PUBLICATIONS

International Search Report of PCT Patent Application No. PCT/CN2014/077172 dated Feb. 17, 2015.

*Primary Examiner* — Darren W Gorman

(57) ABSTRACT

A fire extinguishing device includes a pressure fire extinguishing agent and an accommodating space (1) capable of storing the fire extinguishing agent. A lot of cut-through ejecting openings (2) are defined in an outer wall of the accommodating space (1), and the ejecting openings (2) are plugged by plugging pieces (3) made of a pressure-resistant meltable fireproof material. In the case of a local temperature rise or an open fire of the target in an airtight or semi-airtight space, the plugging piece (3) on the ejecting opening (2) is melted to make the ejecting opening (2) cut through, the pressure fire extinguishing agent stored in the accommodating space is further ejected from the ejecting opening (2) to suppress a fire point or a high temperature point of the target, therefore the fire is controlled at the first time.

8 Claims, 4 Drawing Sheets

(56) References Cited

U.S. PATENT DOCUMENTS

| | | | | |
|---|---|---|---|---|
| 2008/0087446 | A1* | 4/2008 | Sitabkhan .............. | A62C 37/12 169/57 |
| 2010/0132964 | A1* | 6/2010 | Whitney ................ | A62C 3/008 169/56 |

* cited by examiner

FIRE EXTINGUISHING DEVICE AND METHOD THEREOF

FIELD OF THE INVENTION

The present invention belongs to firefighting equipment, and particularly relates to a fire extinguishing device.

BACKGROUND OF THE INVENTION

The destructiveness of fire is extremely serious, for the occurrence of the fire, precaution in advance and rapid disposal are primary things, but for the fire precaution of targets in confined or semi-confined spaces, there is no practical and effective fire extinguishing device at present. The confined or semi-confined spaces are not guarded by specially-assigned person in general, such as electrical cabinets, engine rooms and other places prone to high temperature fire of lines or oil ways, even if alarm sensing equipment is installed, the preliminary state of the fire cannot be effectively restrained, the fire has caused a certain loss or has been out of control when people receive alarms and find the target positions. In addition, the temperature at the beginning of the fire gradually increases, an open fire is generated by the oxygen in the air after rising to an ignition point, it is a better prevention and control method to carry out effective cooling when the temperature of the fire location rises but does not reach the ignition point, however, there is no temperature control device before the ignition point at present.

SUMMARY OF THE INVENTION

Technical Problem

The present invention provides a fire extinguishing device and a fire extinguishing method for solving the problems of fire extinguishment and prevention and control in airtight or semi-airtight spaces.

Technical Solution

To solve the above problems, the present invention provides a fire extinguishing device, including a pressure fire extinguishing agent and an accommodating space capable of storing the fire extinguishing agent, wherein a plurality of cut-through ejecting openings are defined in an outer wall of the accommodating space, and the ejecting openings are plugged by plugging pieces made of a pressure-resistant meltable fireproof material.

Preferably, a through hole is defined in the plugging piece, and the through hole is plugged by a granular choke plug made of a meltable flame-retardant plastic material.

Preferably, the plugging piece is a fusible metal sheet, an edge of the plugging piece is hermetically connected with the edge of the ejecting opening, and the plugging piece is located on an inner surface of the ejecting opening.

Preferably, the fire extinguishing device further includes:

- a control system including an early warning device, a pressure valve and a control circuit, wherein the early warning device and the pressure valve are electrically connected with the control circuit respectively; and a pressure fire extinguishing agent container communicated with the accommodating space through the pressure valve.

Preferably, the plugging piece is strip-shaped, and the early warning device is respectively connected with both ends of the plugging piece through circuits.

Preferably, the early warning device is selected from the group consisting of a temperature sensor, a flame sensor, an infrared spectroscopy flame sensor, an air pressure sensor and combinations thereof.

Preferably, the accommodating space is a pressure-resistant air bag and is made of flexible fireproof materials, and the air bag is connected with the pressure fire extinguishing agent container.

Preferably, an interior of the air bag is divided into multiple air chambers, the air chambers are intercommunicated, the walls of the air chambers are made of the flexible fireproof material, and one or more of the ejecting openings correspond to one of the air chambers.

Preferably, the air bag is provided with a projection and a depression which are set according to actual requirement.

The present invention further provides a fire extinguishing method using the fire extinguishing device, wherein the fire extinguishing device is arranged above or on the surrounding of a target,

- in a temperature rise process of a local part of the target, the granular choke plug corresponding to the local part starts melting at first when reaching a warning temperature, and the pressure fire extinguishing agent starts to be ejected from the through hole formed in the plugging piece to the local part of the target for cooling after the granular choke plug melts,
- at this time, the pressure in the accommodating space changes to trigger the air pressure sensor to notify the control circuit, and the control circuit alarms on one hand,
- when the temperature at the local part of the target rises to a higher level warning temperature, the plugging piece corresponding to the local part starts to melt, the ejecting opening is entirely exposed after the plugging piece melts to eject the pressure fire extinguishing agent to the local part of the target for cooling and fire extinguishment, and
- the control circuit commands the pressure valve to open to supplement the pressure fire extinguishing agent in the accommodating space after obtaining the pressure change of the accommodating space through the air pressure sensor, meanwhile, the control circuit carries out high level alarm;
- or, (2) in the temperature rise process of the local part of the target, the early warning device detects a danger signal and transmits the danger signal to the control circuit when reaching the warning temperature, the control circuit controls the pressure valve to open to pressurize the air bag so as to force the same to unfold, meanwhile, the control circuit alarms, and
- after the air bag unfolds, the ejecting opening closest to the temperature rise position of the local part of the target starts to melt the choke plug or the plugging piece due to the influence of the temperature, so as to directly cool or extinguish the fire in the local area.

Beneficial Effects

By means of the fire extinguishing device provided by the technical solution, in the case of a local temperature rise or an open fire of the target in an airtight or semi-airtight space, the plugging piece on the ejecting opening is melted to make the ejecting opening cut through, the pressure fire extinguishing agent stored in the accommodating space is further ejected from the ejecting opening to suppress a fire point or a high temperature point of the target, therefore the fire is controlled at the first time, an important time interval is obtained for the fire extinguishment, and the fire dangers and destructiveness are minimized.

DETAILED DESCRIPTION OF THE EMBODIMENTS

Figure 1:
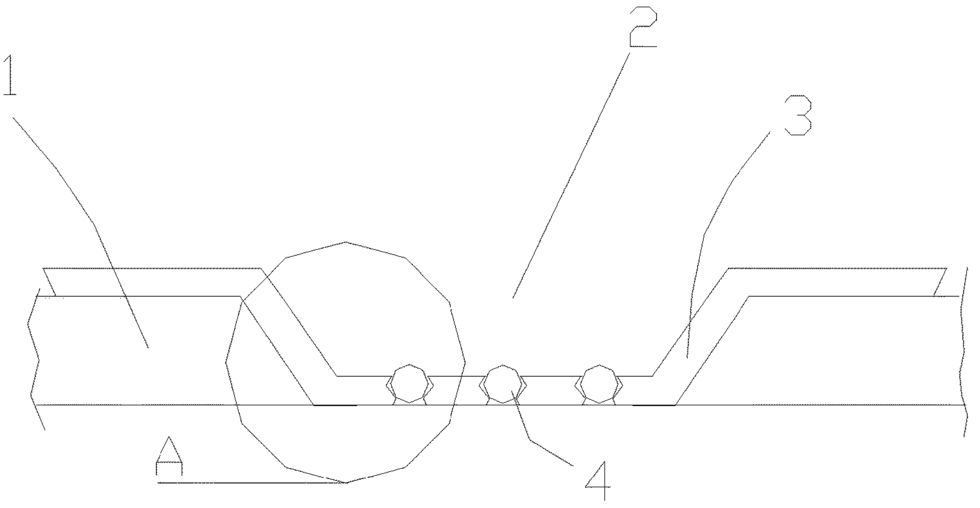
FIG. 1 is a side sectional view of a plugging piece provided by a first embodiment of the present invention.
Figure 2:
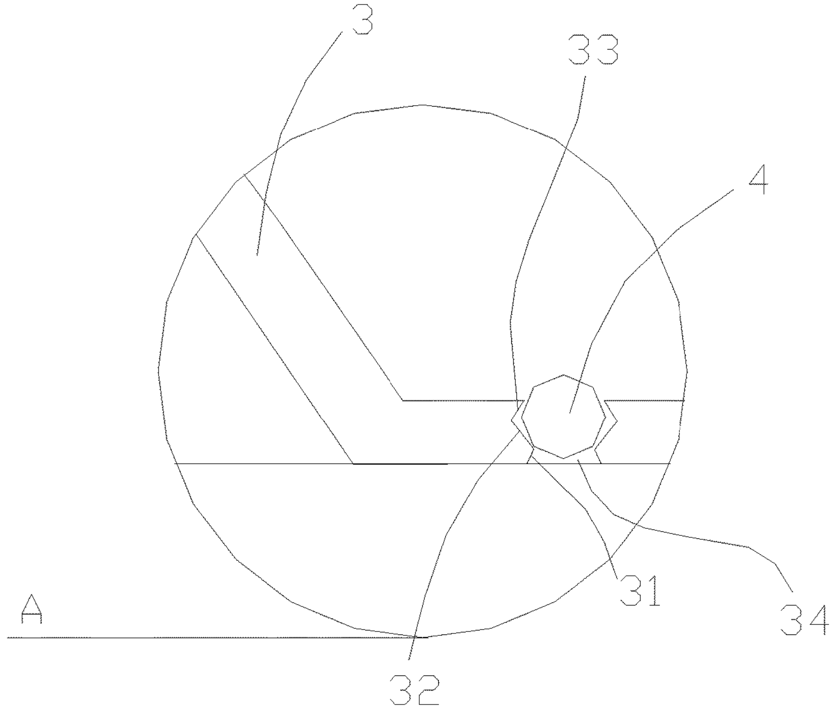
FIG. 2 is an enlarged view of a part A in FIG. 1.
Figure 3:
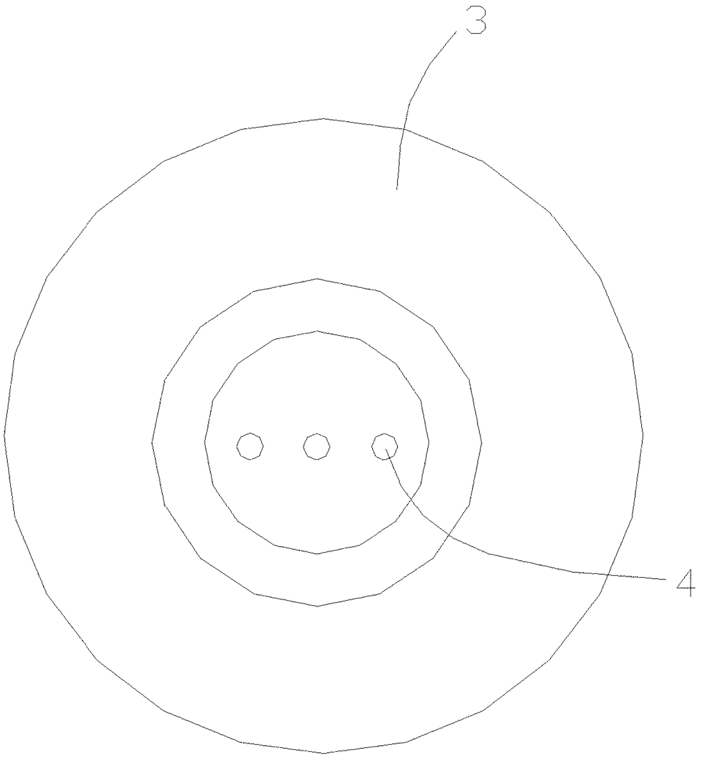
FIG. 3 is a top view of the plugging piece provided by the first embodiment of the present invention.
Figure 4:
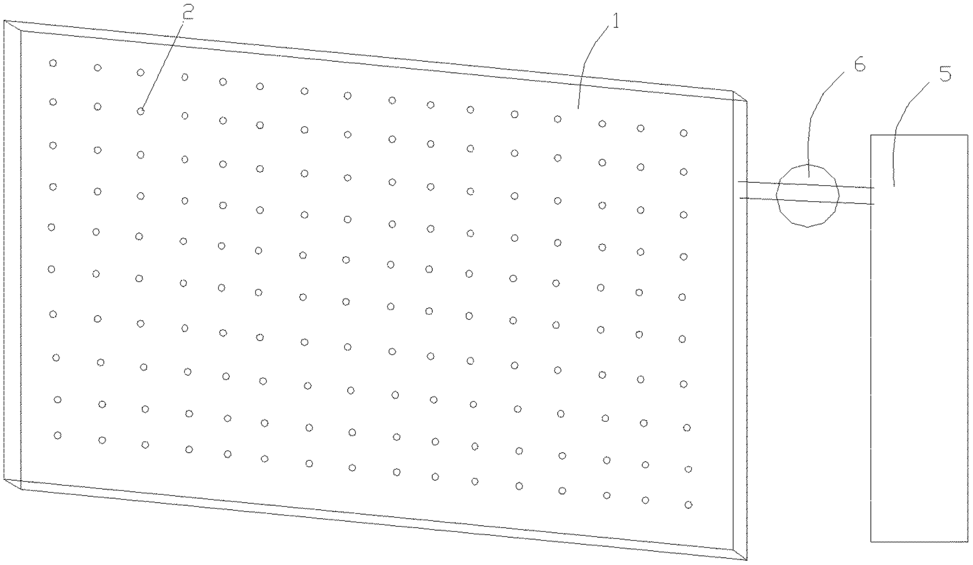
FIG. 4 is a perspective view of an accommodating space provided by the first embodiment of the present invention.

In order that the objectives, technical solutions and advantages of the present invention are clearer, the present invention will be further described below in detail in combination with the drawings and the embodiments. It should be understood that the specific embodiments described herein are merely used for explaining the present invention rather than limiting the present invention.

First Embodiment

As shown in FIGS. 1 to 5 and FIG. 7, the present invention provides a fire extinguishing device, including a pressure fire extinguishing agent and an accommodating space 1 capable of storing the fire extinguishing agent, wherein a plurality of cut-through ejecting openings 2 are defined in an outer wall 11 of the accommodating space 1, and the ejecting openings 2 are plugged by plugging pieces 3 made of a pressure-resistant meltable fireproof material, the fire extinguishing device is arranged above or on the surrounding of a target, in the case of a local temperature rise or an open fire of the target in a confined or semi-confined space, the plugging piece 3 on the ejecting opening 2 is melted when reaching a certain warning temperature to make the ejecting opening 2 cut through, the pressure fire extinguishing agent stored in the accommodating space 1 is further ejected from the ejecting opening 2 to suppress a fire point or a high temperature point of the target, therefore the fire is controlled at the first time, an important time interval is obtained for the fire extinguishment, and the fire dangers and destructiveness are minimized, the plugging piece 3 is a fusible metal sheet, the edge of the plugging piece 3 is hermetically connected with the edge of the ejecting opening 2, and the plugging piece 3 is located on an inner surface of the ejecting opening 2, the edge of the plugging piece 3 is connected with the inner surface of the outer wall 11, the melting temperature of the plugging piece 3 is optional, fusible alloy sheets with melting points of 70 degrees to 280 degrees are available on the market at present, so that the requirement of the technical solution can be completely satisfied, and preferably, a fusible sheet with a melting point higher than 200 degrees is used as the plugging piece 3 in the embodiment.

A through hole 34 is defined in the plugging piece 3, and the through hole 34 is plugged by a granular choke plug 4 made of a meltable flame-retardant plastic material, the choke plug 4 is made of a nonflammable plastic material, which generally can be plastic granules with a melting point temperature within 70-150 degrees, of course, flame-retardant plastic granules or other substance granules exceeding the melting point range can also be selected according to actual requirement, a combustible having certain pressure resistance and a lower ignition point can even be selected to serve as the choke plug 4, meltable flame-retardant plastic granules with a melting point temperature within 70-150 degrees are selected in the embodiment, in the case of local temperature rise of the target, the choke plug 4 on the corresponding plugging piece 3 is affected by the high temperature to melt, the melted choke plug 4 loses the ability of plugging the through hole 34, the pressure fire extinguishing agent in the accommodating space 1 is ejected out from the through hole 34 to cool the local part so as to prevent the temperature in the local area from continuously rising to arrive at the ignition point to form an open fire, the side wall of the through hole 34 is divided into three inclined surfaces, which are respectively a slide-in surface 31, a lower fixing surface 32 and an upper fixing surface 33, the aim of this design is to replace the choke plug 4 with a new choke plug 4 after the temperature rise in the local area of the target resulting in the melting of the choke plug 4, the new choke plug 4 only needs to be forcefully pressed in the space between the lower fixing surface 32 and the upper fixing surface 33 along the slide-in surface 31, then the choke plug 4 can be firmly clamped, the through hole 34 is completely closed under the action of air pressure, and the design can save the cost and achieve flexible change of the choke plugs 4 with different melting points according to different requirements.

Further, the fire extinguishing device further includes:

a control system including an early warning device 7, a pressure valve 6 and a control circuit 8, wherein the early warning device 7 and the pressure valve 6 are electrically connected with the control circuit 8 respectively; and a pressure fire extinguishing agent container 5 communicated with the accommodating space 1 through the pressure valve 6. The early warning device 7 sends a signal to the control circuit 8 when finding abnormal danger, and after receiving the signal, the control circuit 8 sends a command signal to the pressure valve 6 to command the pressure valve 6 to open to inject the pressure fire extinguishing agent into the accommodating space 1, so as to supplement the pressure fire extinguishing agent in the accommodating space 1 and maintain the pressure value in the accommodating space 1.

Figure 5:
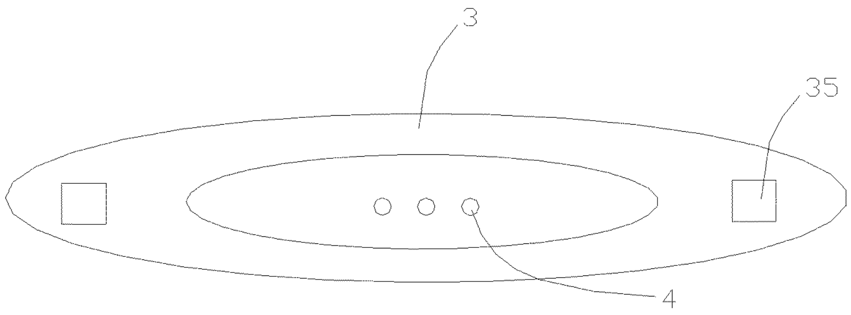
FIG. 5 is a top view of a strip-shaped plugging piece provided by the first embodiment of the present invention.

For the early warning device 7, the embodiment adopts the following several manners, in first manner, with reference to FIG. 5, the plugging piece 3 is set to be strip-shaped, the early warning device 7 is respectively connected with both ends 35 of the plugging piece 3 through circuits, in the case of a fire, the plugging piece 3 is melted to cause an open circuit, and thus the early warning device 7 is started.

In the second manner, the early warning device 7 is a temperature sensor or a flame sensor or an infrared spectroscopy flame sensor or an air pressure sensor or a set of the above devices, wherein the air pressure sensor is mainly used for detecting the pressure change in the accommodating space 1, when the pressure value is lower than a predetermined value, early warning is carried out to notify the control circuit or the control circuit makes a decision after comprehensive judgment made in combination with early warning values of other devices, the temperature sensor carries out early warning by sensing the temperature change in the target or in a target space, the flame sensor and the infrared spectroscopy flame sensor are devices for detection and early warning of open fires, the early warning device 7 can be composed of a single one of the above devices, or the early warning device 7 can also be composed of any combination thereof.

Second Embodiment

Figure 6:
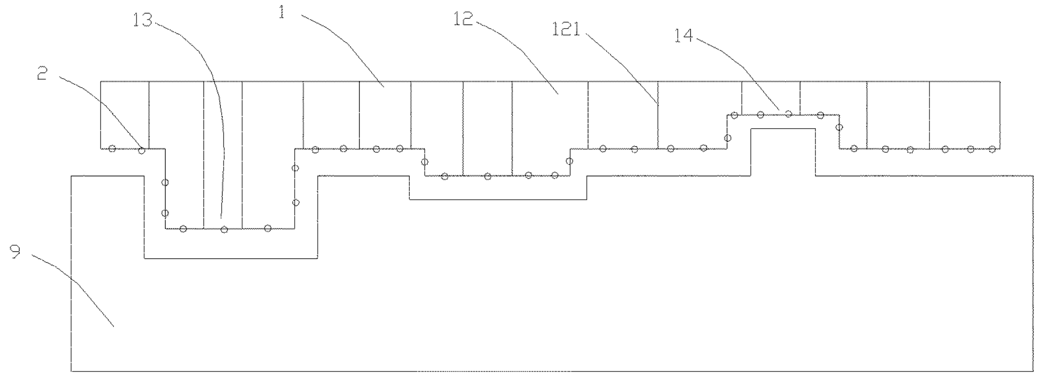
FIG. 6 is a side sectional view of a plugging piece provided by a second embodiment of the present invention.
Figure 7:
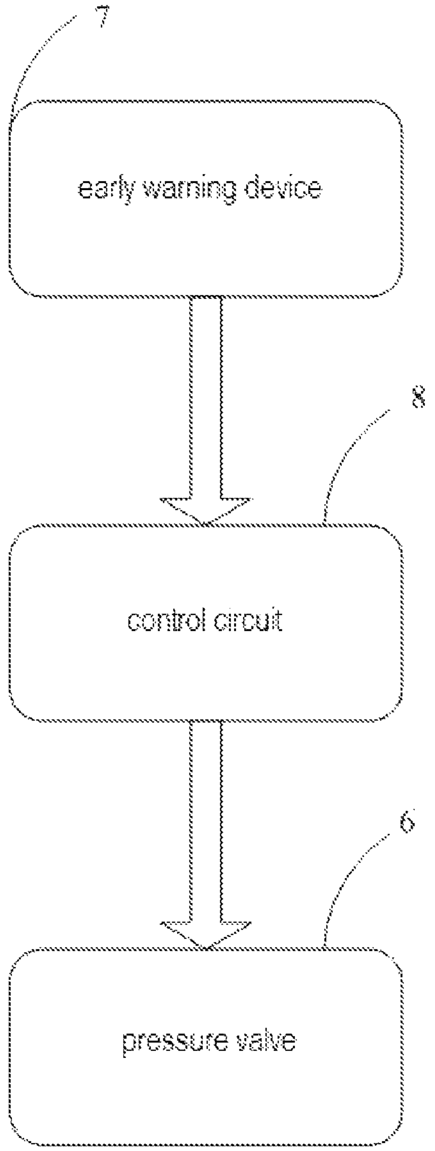
FIG. 7 is a schematic diagram of operation of a control system provided by an embodiment of the present invention.

With reference to FIG. 6 and in conjunction with FIGS. 1 to 5 and FIG. 7, in the fire extinguishing device provided by the embodiment, the accommodating space is a pressure-resistant air bag 1 and is made of a flexible fireproof material, flame-retardant textiles can be adopted, the air bag 1 is connected with the pressure fire extinguishing agent container 5, in order to guarantee the fullness degree of the air bag 1, the interior of the air bag 1 is divided into multiple air chambers 12, the air chambers 12 are intercommunicated, separation walls 121 of the air chambers 12 are made of the flexible fireproof material, one or more of the ejecting openings 2 correspond to one of the air chambers 12, the air bag 1 is provided with a projection 13 and a depression 14, which can be set according to actual requirement, the fire extinguishing device is installed above or on the surrounding of the target 9, the air bag 1 can be collapsed on one side of the target 9 in an unaerated state, the early warning device 7 notifies the control circuit 8 after detecting a danger signal, the control circuit 8 commands the pressure valve 6 to open to quickly inject the fire extinguishing agent into the air bag 1, it should be noted that, only one pressure valve 6 is provided in FIG. 5 in the embodiment, but in a practical application process, it is absolutely possible to use a plurality of pressure valves 6 and a plurality of pressure fire extinguishing agent containers 5 to guarantee that the air bag 1 can quickly unfold as soon as possible, after the air bag 1 unfolds, when the ejecting opening 2 in the air chamber 12 encounters local temperature rise or the ignition point of the target 9, the plugging piece 3 or the choke plug 4 in the ejecting opening 2 is melted by the high temperature, such that the ejecting opening 2 starts functioning, and when the ejecting opening 2 starts functioning, air insufficiency of a single air chamber 12 is caused, instead of the air insufficiency deformation of the entire air bag 1. The technical solution provided by the embodiment is very suitable for a state that the surface of the target 9 is uneven, is also suitable for electrical cabinets, communication equipment cabinets and other unattended electrical equipment spaces, and is also suitable for confined spaces in engine rooms. The fire extinguishing agent mentioned in the two aforementioned embodiments can be optionally liquid nitrogen or a liquid inert gas, carbon dioxide is preferred, because the carbon dioxide or so called dry ice itself has a cooling function, and thus can well reduce the temperature of an abnormal high temperature point in a primary cooling process.

Third Embodiment

The embodiment further provides a fire extinguishing method, and with reference to FIGS. 1 to 7, the fire extinguishing device is employed, and the fire extinguishing device is arranged above or on the surrounding of the target;

(1) in a temperature rise process of a local part of the target 9, the granular choke plug 4 corresponding to the local part starts melting earliest when reaching a warning temperature, and the pressure fire extinguishing agent starts to be ejected from the through hole 34 formed in the plugging piece 3 to the local part of the target 9 for cooling after the granular choke plug melts, at this time, the pressure in the accommodating space 1 changes to trigger the early warning device 7, namely the air pressure sensor to notify the control circuit 8, and the control circuit 8 alarms, when the temperature at the local part of the target 9 rises to a higher level warning temperature or when an open fire is produced, the plugging piece 3 corresponding to the local part starts melting, the ejecting opening 2 is entirely exposed after the plugging piece 3 melts to start eject the pressure fire extinguishing agent to the local part of the target 9 for cooling and fire extinguishment, and the control circuit 8 commands the pressure valve 6 to open to supplement the pressure fire extinguishing agent in the accommodating space 1 after obtaining the pressure change of the accommodating space 1 through the air pressure sensor, meanwhile, the control circuit 8 carries out high level alarm;

or, (2) in the temperature rise process of the local part of the target 9, the early warning device 7 detects a danger signal and transmits the danger signal to the control circuit 8 when reaching the warning temperature, the control circuit 8 controls the pressure valve 6 to open to pressurize the air bag 1 so as to force the same to unfold, meanwhile, the control circuit 8 alarms, and after the air bag 1 unfolds, the ejecting opening 2 closest to the temperature rise position of the local part of the target 9 starts to melt the choke plug 4 or the plugging piece 3 due to the influence of the temperature, so as to directly cool or extinguish the fire in the local area.

By means of the fire extinguishing device provided by the technical solution, in the case of the local temperature rise or the open fire of the target in the confined or semi-confined space, the plugging piece on the ejecting opening is melted to make the ejecting opening cut through, the pressure fire extinguishing agent stored in the accommodating space is further ejected from the ejecting opening to suppress a fire point or a high temperature point of the target, therefore the fire is controlled at the first time, an important time interval is obtained for the fire extinguishment, and the fire dangers and destructiveness are minimized.

The foregoing descriptions are merely preferred embodiments of the present invention which are not used for limiting the present invention, and any modifications, equivalent substitutions and improvements and the like made within the spirit and principle of the present invention shall all fall within the protection scope of the present invention.

The invention claimed is:

1. A fire extinguishing device comprising:

a pressure fire extinguishing agent; and a pressure-resistant container having an accommodating space, the accommodating space being capable of storing the fire extinguishing agent, wherein a plurality of cut-through ejecting openings are defined in an outer wall of the pressure-resistant container, the ejecting openings are plugged by plugging pieces made of a pressure-resistant meltable fireproof material, a through hole is defined in each plugging piece, and each through hole is plugged by a granular choke plug made of a meltable flame-retardant plastic material.

2. The fire extinguishing device of claim 1, wherein each plugging piece is a fusible metal sheet, each plugging piece is hermetically connected with each ejecting opening, and each plugging piece is located on an inner surface of each ejecting opening.

3. The fire extinguishing device of claim 1, further comprising:

a control system comprising an early warning device, a pressure valve and a control circuit, wherein the early warning device and the pressure valve are electrically connected with the control circuit respectively; and a pressure fire extinguishing agent container communicated with the accommodating space through the pressure valve.

4. The fire extinguishing device of claim 3, wherein each plugging piece is strip-shaped, and the early warning device is connected to each plugging piece.

5. The fire extinguishing device of claim 3, wherein the early warning device is selected from the group consisting of a temperature sensor, a flame sensor, an infrared spectroscopy flame sensor, an air pressure sensor and combinations thereof.

6. The fire extinguishing device of claim 3, wherein the pressure-resistant container is a pressure-resistant air bag and is made of a flexible fireproof material, and the air bag is connected with the pressure fire extinguishing agent container.

7. The fire extinguishing device of claim 6, wherein an interior of the air bag is divided into multiple air chambers, the air chambers are intercommunicated, walls of the air chambers are made of flexible fireproof materials, and one or more of the ejecting openings correspond to one of the air chambers.

8. The fire extinguishing device of claim 6, wherein the air bag is provided with a projection and a depression which are set according to actual requirement.

* * * * *